(12) United States Patent
Akarvardar et al.

(10) Patent No.: US 9,184,162 B2
(45) Date of Patent: Nov. 10, 2015

(54) FINFET INTEGRATED CIRCUITS AND METHODS FOR THEIR FABRICATION

(71) Applicant: GLOBALFOUNDRIES, Inc., Grand Cayman (KY)

(72) Inventors: Murat Kerem Akarvardar, Saratoga Springs, NY (US); Xiuyu Cai, Niskayuna, NY (US); Ajey Poovannummoottil Jacob, Albany, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/615,762

(22) Filed: Feb. 6, 2015

(65) Prior Publication Data
US 2015/0179644 A1    Jun. 25, 2015

Related U.S. Application Data

(63) Continuation of application No. 13/937,939, filed on Jul. 9, 2013, now Pat. No. 8,987,094.

(51) Int. Cl.
*H01L 27/12* (2006.01)
*H01L 27/088* (2006.01)
*H01L 29/06* (2006.01)

(52) U.S. Cl.
CPC ........ *H01L 27/0886* (2013.01); *H01L 29/0653* (2013.01)

(58) Field of Classification Search
CPC ............ H01L 29/785; H01L 29/66795; H01L 29/7848; H01L 29/7842; H01L 29/7855; H01L 29/7851; H01L 29/06; H01L 29/1033
USPC .................................................. 257/347, 622
See application file for complete search history.

(56) References Cited

U.S. PATENT DOCUMENTS

| | | | |
|---|---|---|---|
| 7,636,257 B2 * | 12/2009 | Lue ......................... | 365/185.18 |
| 7,687,368 B2 | 3/2010 | Kawasaki et al. | |
| 7,994,020 B2 | 8/2011 | Lin et al. | |
| 2005/0130439 A1 * | 6/2005 | Goo et al. ..................... | 438/763 |
| 2007/0034925 A1 | 2/2007 | Lee et al. | |
| 2011/0220981 A1 * | 9/2011 | Chen et al. .................... | 257/316 |
| 2012/0091511 A1 * | 4/2012 | Chen et al. .................... | 257/213 |
| 2012/0132984 A1 | 5/2012 | Mifuji et al. | |
| 2013/0181263 A1 | 7/2013 | Cai et al. | |

* cited by examiner

*Primary Examiner* — Trung Q Dang
(74) *Attorney, Agent, or Firm* — Ingrassia Fisher & Lorenz, P.C.

(57) ABSTRACT

Fin field effect transistor integrated circuits and methods for producing the same are provided. A fin field effect transistor integrated circuit includes a plurality of fins extending from a semiconductor substrate. Each of the plurality of fins includes a fin sidewall, and each of the plurality of fins extends to a fin height such that a trough with a trough base is defined between adjacent fins. A second dielectric is positioned within the trough, where the second dielectric directly contacts the semiconductor substrate at the trough base. The second dielectric extends to a second dielectric height less than the fin height such that protruding fin portions extend above the second dielectric. A first dielectric is positioned between the fin sidewall and the second dielectric.

19 Claims, 6 Drawing Sheets

FINFET INTEGRATED CIRCUITS AND METHODS FOR THEIR FABRICATION

CROSS-REFERENCE TO RELATED APPLICATIONS

This application is a continuation of U.S. patent application Ser. No. 13/937,939, filed Jul. 9, 2013.

TECHNICAL FIELD

The present invention generally relates to fin field effect transistor (FinFET) integrated circuits and to methods for their manufacture, and more particularly relates to FinFET integrated circuits with uniform dielectric isolation between the fins and to methods for fabricating such circuits.

BACKGROUND

Transistors such as metal oxide semiconductor field effect transistors (MOSFETs) or simply field effect transistors (FETs) are the core building blocks of the vast majority of semiconductor integrated circuits (ICs). A FET includes source and drain regions between which a current can flow through a channel under the influence of a bias applied to a gate electrode that overlies the channel. Some semiconductor ICs, such as high performance microprocessors, can include hundreds of millions of FETs. For such ICs, decreasing transistor size and thus increasing transistor density has traditionally been a high priority in the semiconductor manufacturing industry. Transistor performance, however, must be maintained even as the transistor size decreases.

A fin field effect transistor (FinFET) is a type of transistor that lends itself to the dual goals of reducing transistor size while maintaining transistor performance. The FinFET is a three dimensional transistor formed in a thin fin that extends upwardly from a semiconductor substrate. In a FinFET the transistor channel is formed along the vertical sidewalls of the fin, so a wide channel, and hence a very efficient layout, can be achieved without substantially increasing the area of the substrate surface required by the transistor. Additionally, the 3 dimensional structure allows the use of undoped channels, which improves short channel control, reduces leakage, and improves carrier mobility over doped channels.

There are various methods of producing FinFET IC's, including the use of semiconductor on insulator (SOI) substrates. Alternatively, a FinFET can be fabricated from a bulk semiconductor substrate, which has a lower cost compared to an SOI substrate. The fins are formed from a bulk semiconductor substrate, so the fins and the base of the substrate are one continuous component. When using a bulk semiconductor substrate, a dielectric insulator is typically used between adjacent fins to determine the active fin height. The insulator is typically applied to fill the area between the fins and to extend over the top of the fins. Flowable oxides (known by the trademark FOX®), high aspect ratio processes (HARP), enhanced high aspect ratio processes (eHARP), and other techniques can be used to fill the area between the fins. However, if the fins have a high aspect ratio, such as when the fin to fin distance is about 20 nanometers (nm) or less, the options for a void-free fill between the fins is limited primarily to FOX®. FOX® utilizes a steam anneal for densification, which may oxidize the fins. Also, the wet etch resistance of FOX® is less than that of thermal oxide by a factor of about 1.5 to 2, and higher wet etch resistance may be desired. The upper surface of the insulator, which is over the fin tops, is then planarized, which may use chemical mechanical planarization (CMP). The insulator is then recessed by wet or dry etch to a desired height below the fin tops, so a portion of the fins extend over the insulator. The portions of the fins that extend over the insulation are then further processed to form FETs.

The etching process is not perfectly uniform, so the height of the insulator between the fins varies from one location to another. The etching process also leaves a rough surface, so the top of the insulator is not smooth. The variations in insulation height change the effective width of the FinFET channel, because the channel is formed along the vertical sidewalls of the fin. The FinFET's conductance and transconductance is proportional to the channel width, so the transistor conductance and transconductance varies from one fin to the next as the height of the insulation varies. Furthermore, the exact depth of the etching cannot be precisely controlled, so the variation in the conductance and transconductance from one FET to the next is not controlled or known.

Accordingly, it is desirable to provide a bulk FinFET IC that overcomes the problem of varying transconductance from one FET to the next. In addition, it is desirable to provide methods for fabricating a FinFET IC on a bulk semiconductor substrate that reduces the variation in transconductance from one FET to the next. Furthermore, other desirable features and characteristics of the present invention will become apparent from the subsequent detailed description and the appended claims, taken in conjunction with the accompanying drawings and the foregoing technical field and background.

BRIEF SUMMARY

Fin field effect transistor integrated circuits and methods for producing the same are provided. In an exemplary embodiment, a fin field effect transistor integrated circuit includes a plurality of fins extending from a semiconductor substrate. Each of the plurality of fins includes a fin sidewall, and each of the plurality of fins extends to a fin height such that a trough with a trough base is defined between adjacent fins. A second dielectric is positioned within the trough, where the second dielectric directly contacts the semiconductor substrate at the trough base. The second dielectric extends to a second dielectric height less than the fin height such that protruding fin portions extend above the second dielectric. A first dielectric is positioned between the fin sidewall and the second dielectric.

In another embodiment, a fin field effect transistor integrated circuit includes a plurality of fins extending from a semiconductor substrate, where the fins define a trough therebetween. The fins have a fin to fin distance of about 20 nanometers or less, and a second dielectric is positioned within the trough. The second dielectric includes silicon dioxide and has a wet etch resistance greater than the wet etch resistance of flowable oxide.

In yet another embodiment, a fin field effect transistor integrated circuit includes a plurality of fins extending from a semiconductor substrate, where the fins define a trough therebetween. A second dielectric is positioned within the trough, where the second dielectric includes silicon dioxide. The second dielectric has a second dielectric top surface that is smoother than a silicon dioxide top surface formed by an etching process.

BRIEF DESCRIPTION OF THE DRAWINGS

The present invention will hereinafter be described in conjunction with the following drawing figures, wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description. The use of "up" or "upwardly" are intended only to imply reference to the surface of a semiconductor substrate.

Figure 1:
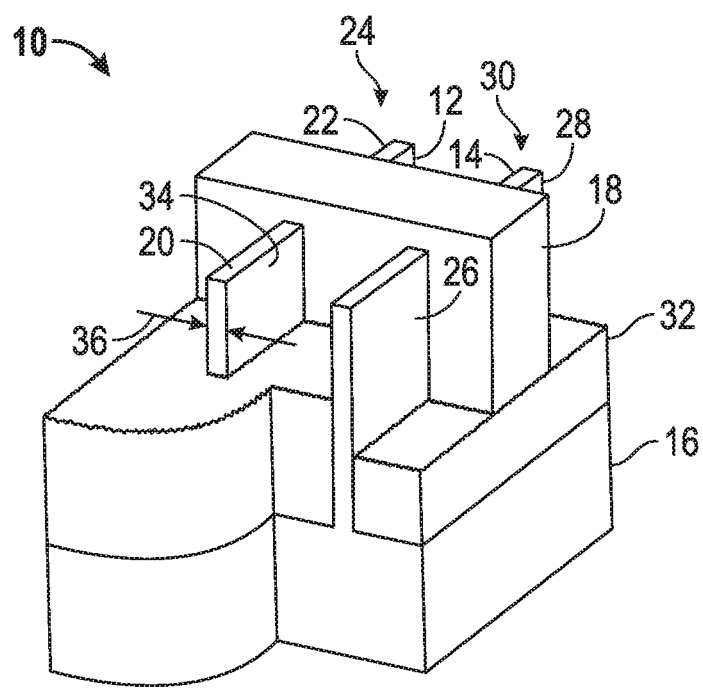
FIG. 1 illustrates, in a cut away perspective view, a portion of a prior art FinFET integrated circuit.

FIG. 1 illustrates, in a cut away perspective view, a portion of a prior art FinFET integrated circuit (IC) 10. The illustrated portion of IC 10 includes two fins, including a first fin 12 and a second fin 14 that are formed from and extend upwardly from a bulk semiconductor substrate 16. Fins that are formed from a substrate, and extend upward from it without a break in the crystalline structure, are said to be bulk FinFETs. A gate electrode 18 overlies the first and second fins 12, 14 and is electrically insulated from the fins 12, 14 by a gate insulator (not illustrated). One end of the first fin 12 is appropriately impurity doped to form the first source 20 of a first field effect transistor 24 and the other end of that fin 12, which is on the other side of the gate electrode 18, is appropriately impurity doped to form the drain 22 of the first FET 24. Similarly, the ends of the second fin 14, where the ends are on opposite sides of the gate electrode 18, form the source 26 and drain 28 of the second FET 30. The illustrated portion of the IC 10 thus includes a first and second FET 24, 30 having a common gate electrode 18.

In another configuration, if the first source 20 and the second source 26 are electrically coupled together and the first drain 22 and the second drain 28 are electrically coupled together, the structure would be a two-fin FinFET having twice the gate width of either the first or second FET 24, 30. Dielectric 32 is an insulating oxide layer that determines the active fin height for the fins 12, 14, and provides electrical isolation between adjacent devices as is needed for the circuit being implemented. The channel of the first FinFETs 24 extends along the fin sidewall 34 of first fin 12 beneath gate electrode 18 as well as along the opposite sidewall 34 not visible in this perspective view. One of the advantages of the FinFET structure is that although the fin has only the narrow width represented by the arrows 36, the channel has a width represented the fin sidewall 34 from the upper surface of the dielectric 32 to the fin top, plus the distance across the fin top, plus the opposite fin sidewall 34 from the fin top to the surface of the dielectric 32. The channel width thus can be much greater than the fin width 36. However, the height of the dielectric 32 is shown to vary on opposite sides of second FinFET 30, so the channel width of the first FinFET 24 is smaller than the channel width of the second FinFET 30. This different channel width results in a different transconductance for the first and second FinFETs 24, 30.

FIGS. 2-9 illustrate a FinFET IC 100 and methods for its fabrication, in accordance with various embodiments, that avoid the previously described problem of varying transconductance, without degrading the performance of the IC 100. FIGS. 2-9 are cross sectional views perpendicular to a plurality of fin structures, where only a portion of the FinFET IC 100 is illustrated. Various steps in the manufacture of ICs are well known to those of skill in the art and so, in the interest of brevity, many conventional steps will only be mentioned briefly herein or will be omitted entirely without providing the well-known process details.

Figure 2:
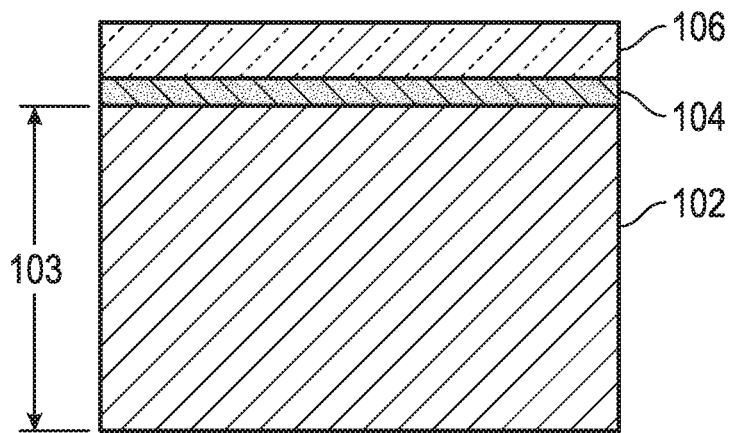
FIGS. 2-9 illustrate, in cross sectional views, a portion of a FinFET integrated circuit and methods for its fabrication in accordance with exemplary embodiments.

As illustrated in cross section in FIG. 2, the method in accordance with one embodiment begins by providing a bulk semiconductor substrate 102. The semiconductor substrate 102 can be, for example, a monocrystalline wafer of silicon, silicon alloyed with germanium or other doping materials, or other semiconductor material commonly used in the semiconductor industry for the fabrication of semiconductor integrated circuits. Doping materials are sometimes referred to as doping impurities. The semiconductor substrate 102 is a crystalline material having a substrate depth 103. At least a well region of the semiconductor substrate 102 may be doped with conductivity determining impurities. If the FinFET IC 100 being fabricated is a complementary metal oxide semiconductor (CMOS) IC, there will be at least one well region of the semiconductor substrate 102 that is impurity doped with N-type impurities and at least one well region doped with P-type impurities. The region, either N-type or P-type, can be doped, for example, by ion implantation, and the impurity doping can be performed before or after other steps in the IC manufacture. Multiple ion implantation steps may be used to achieve the desired dopant concentration and profile.

An etch mask 104, such as a layer of silicon nitride or other hard mask material, is formed overlying the surface of the semiconductor substrate. The etch mask material 104 can be deposited by chemical vapor deposition (CVD), low pressure chemical vapor deposition (LPCVD), plasma enhanced chemical vapor deposition (PECVD), rapid thermal chemical vapor deposition (RTCVD), or the like. The etch mask 104 is patterned to form a layer overlying the intended locations of a plurality of fins and possibly other structures, and typically has a thickness of a few hundred nanometers (nm), but other thicknesses are also possible. In accordance with one embodiment, a photosensitive layer of photoresist 106 is deposited on the etch mask 104, and the photoresist 106 is patterned by exposing selected areas to electromagnetic radiation. The photoresist 106 can be applied as a liquid to a spinning substrate 102, and then solidified, but other methods can also be used. The photoresist 106 is developed to expose portions of the etch mask 104, and portions of the etch mask 104 are then removed by etching to expose selected portions of the substrate 102 underneath. The remaining photoresist 106 is then removed, and the portions of the etch mask material that remain are the etch mask 104 for the substrate 102.

Figure 3:
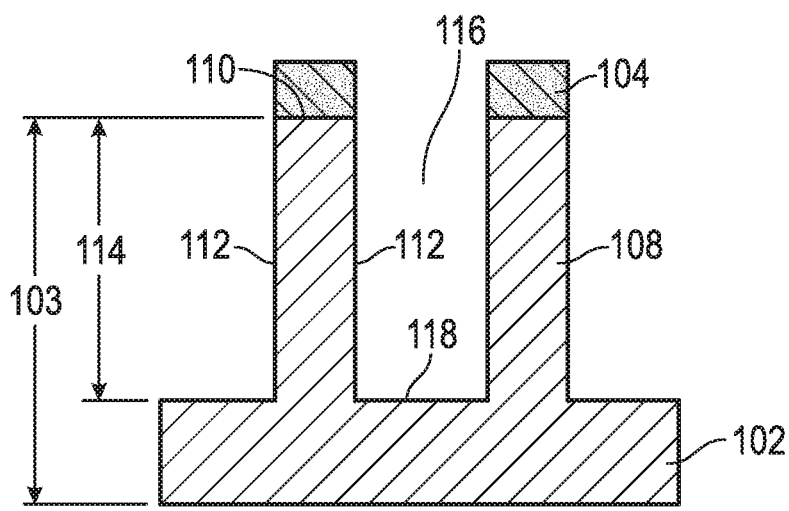

The method in accordance with one embodiment continues as illustrated in FIG. 3. The semiconductor substrate 102 exposed by the etch mask 104 is anisotropically etched to form a plurality of fins 108, only two of which are illustrated. The fins 108 have a fin top 110 as the top surface, fin sidewalls 112 which are the side surfaces, and a fin height 114 that extends from the fin top 110 to the base of the fin 108. The fin height 114 is less than the substrate depth 103, so the fins 108 do not extend all the way through the substrate 102. A trough 116 is defined by the fin sidewalls 112 and by a trough base 118, where the anisotropic etching removed the substrate 102 to form the troughs 116. The trough base 118 is the part of the semiconductor substrate 102 exposed at the bottom of the trough 116. Sidewall image transfer methods may be used to etch the fins 108, which can yield fins 108 about 10 nm wide in some embodiments. The semiconductor substrate 102 can be etched, for example, by reactive ion etching (RIE) using any of the common semiconductor etchants.

Figure 4:
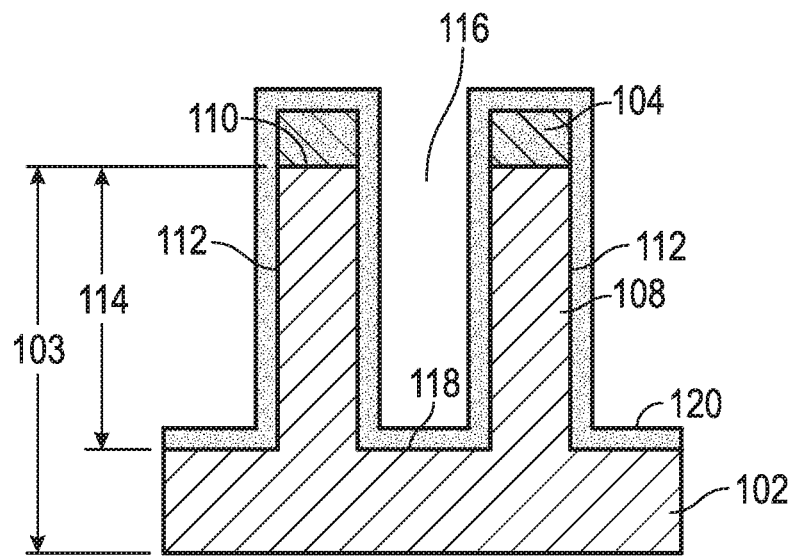

The exposed surfaces are then coated with a first dielectric 120, where the first dielectric 120 may serve as a liner, as illustrated in FIG. 4 and explained in greater detail below. The exposed surfaces include the etch mask 104 that sits on top of the fin tops 110, as well as the fin sidewalls 112 and the trough base 118. The first dielectric 120 can be silicon nitride, which can be deposited as described above, but other materials or methods could also be used. For example, the first dielectric 120 could be deposited using plasma enhanced atomic layer deposition (PEALD), which typically produces a thickness of about 10-15 nm, but other thicknesses are possible. The fin tops 110 have a thick coating now, because the remaining etch mask 104 was covered with the first dielectric 120, so the fin tops 110 have two coatings. Both coatings may be silicon nitride, but the two coatings on the fin top 110 do not have to be the same material, and either or both coatings could be something other than silicon nitride. In some embodiments, the etch mask 104 and the first dielectric 120 are the same material, in which case the etch mask 104 can effectively serve as a part of the first dielectric 120.

Figure 5:
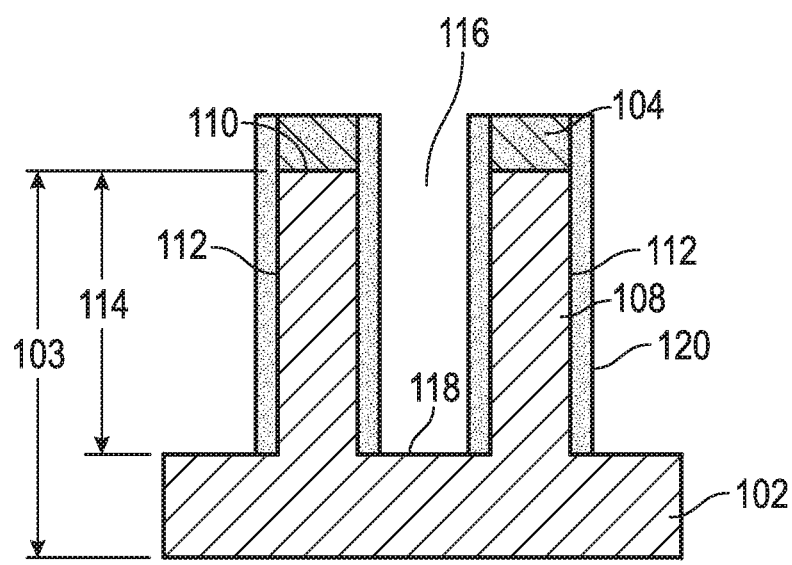

FIG. 5 illustrates the next step, where the first dielectric 120 is removed from the trough base 118, but the first dielectric 120 is left as a coating the fin sidewalls 112. The etch mask 104 is left as a coating on the fin tops 110, so the fins 108 are encased in the etch mask 104 and the first dielectric 120. If the etch mask 104 and the first dielectric 120 are both the same material, such as silicon nitride, then the same material continuously coats all of the exposed surfaces of the fins 108. Anisotropic etching can be used to remove the first dielectric 120 from the trough base 118 without removing it from the fin sidewalls 112. The anisotropic etchant etches at least part of the first dielectric 120 from the fin tops 110 to approximately the same extent as the trough base 118 in embodiments where both the fin tops 110 and the trough base 118 are generally horizontal in nature, but the etch mask 104 remains under the first dielectric 120 on the fin tops 110. A coating remains on the fin tops 110 even after the first dielectric 120 is removed from the trough base 118 because of the extra protection provided to the fin tops 110 by double coating. In embodiments where the etch mask 104 is the same material as the first dielectric 120, the remaining etch mask 104 effectively becomes the first dielectric 120 coating the fin tops 110, and can be referred to as such. In some embodiments, an etchant that is selective or preferential to the first dielectric 120 relative to the substrate 102 is used, which can minimize unnecessary etching of the substrate 102 at the trough base 118.

Figure 6:
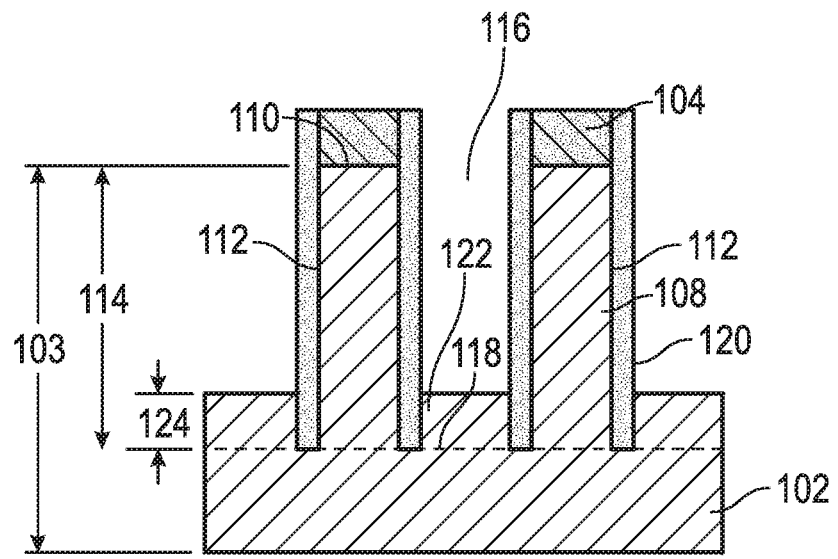

After exposing the substrate 102 at the trough base 118, the trough 116 is partially filled with a trough filler 122 to a trough filler height 124, as shown in FIG. 6. The trough filler 122 is crystallized from the exposed substrate 102 at the trough base 118, but the trough filler 122 does not crystallize from the first dielectric 120 or the etch mask 104. The substrate 102 is a crystalline material, and the first dielectric 120 and the etch mask 104 can be amorphous, so selective epitaxial growth can be used to deposit the trough filler 122. With selective epitaxial growth, the trough filler 122 will crystallize and grow from exposed crystals in the substrate 102, but not from amorphous materials in the first dielectric 120 or the etch mask 104, so the trough filler 122 is an epitaxial trough filler 122. Selective epitaxial growth provides for a very conformal, uniform and consistent growth rate, so the trough filler height 124 is very consistent within a trough 116 and from one trough 116 to the next. Selective epitaxial growth can be used to fill essentially any gap area, including gaps with a high aspect ratio. Therefore, when the fin 108 to fin 108 distance is reduced or scaled down, even to distances of 20 nm or less, the epitaxial trough filler 122 can still be deposited in the trough without any voids.

Various techniques can be used for the selective epitaxial growth, such as vapor phase epitaxy (VPE), molecular beam epitaxy (MBE), or liquid phase epitaxy (LPE). The selective epitaxial growth can be performed rapidly, which may result in imperfections and flaws in the crystals of the trough filler 122. Even with rapid epitaxial growth, the growth rate remains very uniform and consistent, despite the various imperfections and flaws in the newly grown crystals, so the trough filler height 124 remains very consistent. Therefore, the trough filler 122 does not have to be defect free, which widens the epitaxial fill process window substantially. The trough filler 122 can be silicon or another semiconductor material, which may or may not include doping impurities, and the doping impurities may or may not match those of the substrate 102. For example, silane or dichlorosilane based epitaxial process may be used, but other processes are also possible. If the substrate 102 is formed from a silicon material, a silicon trough filler 122 will extend the crystals of the substrate 102 into the trough 116, although there may be a higher frequency of crystal flaws and imperfections in the trough filler 122 than in the substrate 102. In some embodiments, the trough filler 122 and the substrate 102 are primarily formed of the same material.

Figure 7:
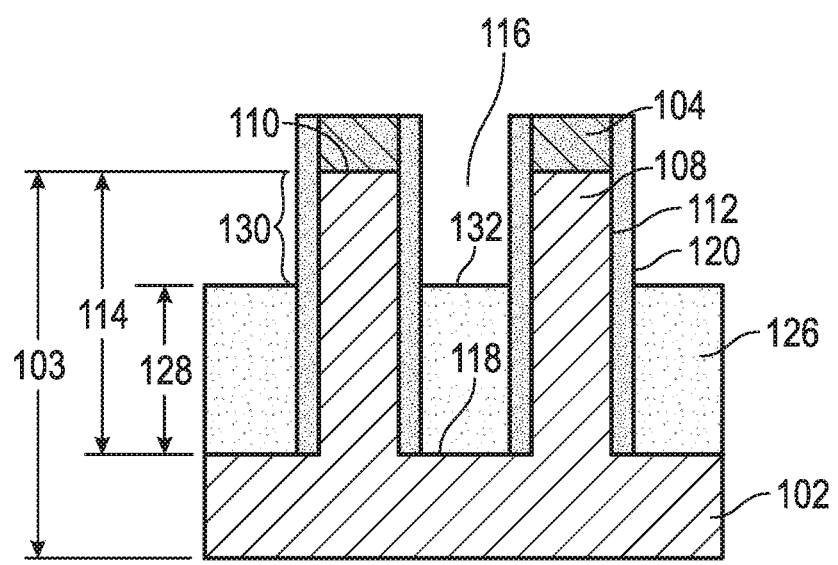

In accordance with one embodiment, the method for fabricating the FinFET IC 100 continues by oxidizing the trough filler 122. FIG. 7 illustrates where the trough filler 122 is oxidized to produce a second dielectric 126. The oxidized trough filler 122 is an insulating dielectric material, which would be silicon oxide in embodiments where the trough filler 122 is primarily composed of silicon. The second dielectric 126 can be a different material than the first dielectric 120. In embodiments where the trough filler 122 includes silicon, the silicon can be oxidized to form silicon oxide by exposing it to an oxidizing ambient at an elevated temperature. The fins 108 made of silicon or other material are protected from oxidation by the first dielectric 120 and the etch mask 104, so the fins 108 do not oxidize and form an insulating dielectric. The outer surface of the first dielectric 120 may oxidize somewhat, but the first dielectric 120 oxidizes at a much slower rate than the trough filler 122, so the fins 108 are protected from oxidation. Silicon nitride is one material that is effective at protecting the fins 108 from oxidation while the trough filler 122 is oxidized. Oxidation of the silicon causes the material of the second dielectric 126 to occupy more space than the trough filler 122, so the second dielectric height 128 is higher than the trough filler height 124, at least in embodiments where the trough filler 122 includes silicon. However, the amount of trough filler 122 deposited is selected such that the second dielectric height 128 is shorter than the fin height 114. Therefore, a protruding fin portion 130 extends above the second dielectric top surface 132.

The oxidation of silicon produces a smooth second dielectric top surface 132, which is at least smoother than a silicon dioxide top surface left by an etching process. The second dielectric top surface 132 is a silicon dioxide top surface in embodiments where the second dielectric 126 is silicon dioxide. The oxidation of the trough filler 122 provides a way to fill the trough without etching or removing the filling material from over the top of the fins 108. In embodiments where the trough filler 122 is primarily composed of silicon, the silicon oxide has a higher wet etch resistance than a filling material produced from flowable oxide (FOX®), and this higher wet etch resistance can be beneficial for subsequent processing steps. Therefore, the oxidation of an epitaxial silicon trough filler 122 provides a second dielectric 126 that is void free and has a higher wet etch resistance than FOX®, regardless of the trough dimensions. For example, even in embodiments where the fin 108 to fin 108 distance is scaled down to distances of about 20 nm or smaller, the second dielectric 126 in the trough 116 can be void free with a higher wet etch resistant than FOX®.

The oxidation of silicon is a predictable reaction that results in a very consistent growth of silicon to form silicon oxide. The epitaxial crystallization of silicon to produce the trough filler 122 is also a very consistent deposition process. Therefore, the second dielectric top surface 132 is at a very consistent second dielectric height 128, so the height of the protruding fin portions 130 is very consistent along the length of a fin 108, and also very consistent from one fin 108 to the next. The protruding fin portions 130 are then further processed to produced FinFETs, and the consist height of the protruding fin portions 130 makes for a very consistent and predictable conductance and transconductance for the Fin- FETs. The increased consistency from a smoother second dielectric top surface 132 and consistent depth of the second dielectric 126 within the trough 116 also facilitate more consistent FinFET performance, because more consistent components are utilized.

Figure 8:
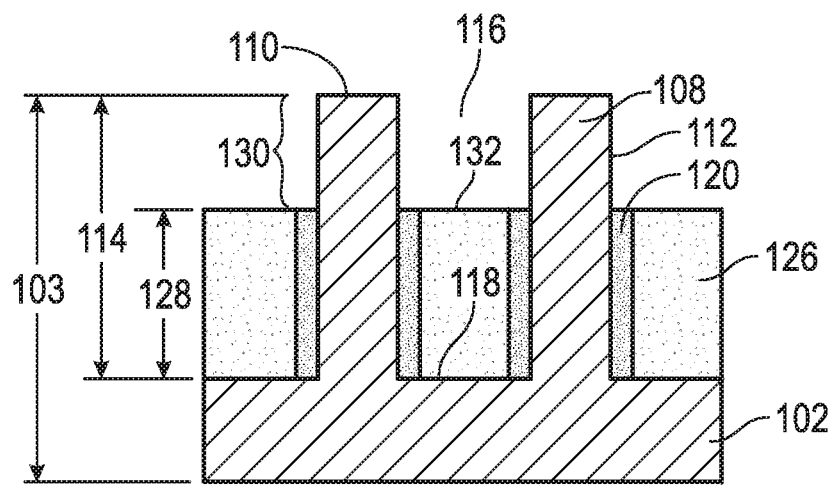

FIG. 8 illustrates the next processing step. Once the second dielectric 126 is formed, the exposed first dielectric 120 and the remaining etch mask 104 can be removed. An etchant that preferentially etches the first dielectric 120 over the second dielectric 126 can be used, so the first dielectric 120 and the etch mask 104 are removed with little to no change in the second dielectric 126. If the first dielectric 120 and the etch mask 104 are silicon nitride, the same etchant can be used to remove both, such as dipping the FinFET IC 100 in hot phosphoric acid or using a RIE process with high selectivity for silicon nitride over silicon. After removing the first dielectric 120 and the etch mask 104, the protruding fin portions 130 can be further processed to produce FETs and ICs. A layer of first dielectric 120 remains along the fin sidewalls 112 below the second dielectric top surface 132, but not above the second dielectric top surface 132. The first dielectric 120 is only exposed to the etchant above the second dielectric top surface 132, because the second dielectric 126 protects the first dielectric 120 positioned underneath the second dielectric top surface 132. The first dielectric 120 contacts the fin sidewalls 112 below the second dielectric top surface 132, but not above the second dielectric top surface 132.

Figure 9:
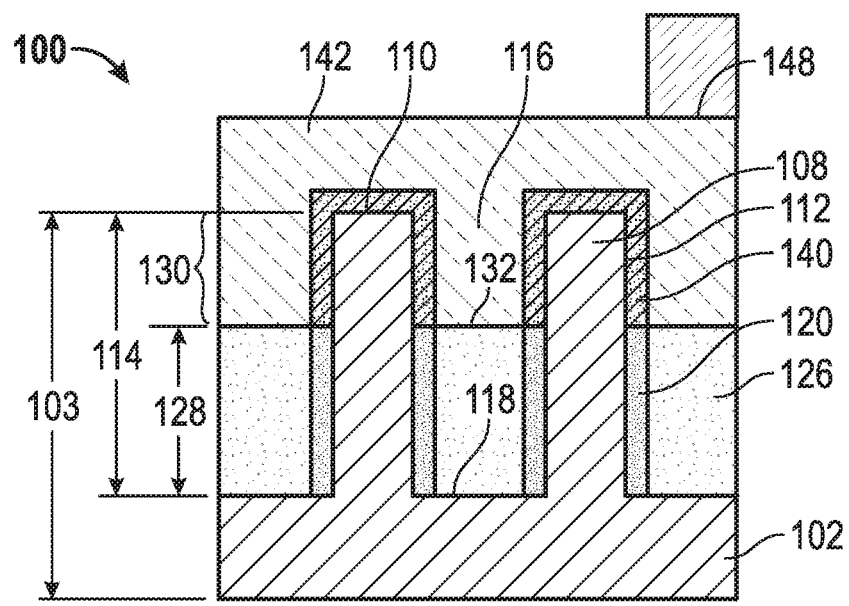
Figure 10:
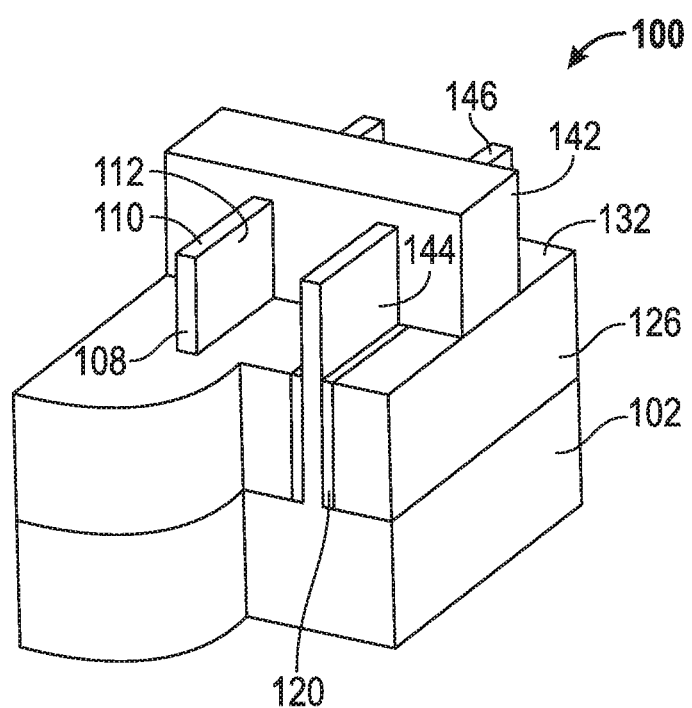
FIG. 10 illustrates, in a cut away perspective view, a portion of one embodiment of a FinFET integrated circuit.

The FinFET is then incorporated into an IC 100 by a wide variety of known methods, as illustrated in FIGS. 9 and 10. A gate insulator 140 and a gate electrode 142 can be formed overlying the fins 108, where the gate insulator 140 contacts the fins 108 and the gate electrode 142 contacts the gate insulator 140. FIG. 10 shows two fins 108 with a common gate electrode 142, but there could also be separate gate electrodes 142 for each fin 108. The gate insulator 140 can be silicon oxide, nitrided silicon oxide, a high dielectric constant insulator, combinations of such insulators, and the like. The gate insulator 140 is typically less than two nanometers in thickness. The gate electrode 142 can be polycrystalline or amorphous silicon, metal, other conductive materials, or combinations of such materials. The gate insulator 140 and gate electrode 142 materials are selected based on the circuit being implemented and the requirements of the particular transistor being utilized in that circuit. The material selected for the gate electrode 142 can be blanket deposited and lithographically patterned. Bias applied to the gate electrode 142 will control the flow of current through a channel within the fin 108 under the gate electrode 142. The process described is suitable for both gate-first and replacement gate schemes.

After the gate electrode 142 is in place, the portions of the fins 108 that are not covered by the gate electrode 142 are impurity doped with a conductivity determining dopant of opposite doping type compared to the doping type of the semiconductor substrate 102. For example, if the FinFET IC 100 is an N-channel FET, the end portions are doped with N-type conductivity determining impurities to form a source region 144 and a drain region 146 on opposite sides of the gate electrode 142. The N-type source and drain regions 144, 146 can be doped, for example, by implanting arsenic or phosphorous ions. The FinFET IC 100 can be doped by ion implantation, or by plasma doping, or by other techniques. The IC 100 can be heated, for example by rapid thermal annealing (RTA), to diffuse the implanted ions. The impurity doping concentrations in the sources and drains 144, 146 as well as other portions of the FinFET IC 100, are established based on the desired characteristics of the device being implemented. Various electrical contacts 148 and other electronic components can then be added to the IC 100, such that the FinFET is incorporated into the IC 100 and the FinFET is electrically connected to other electronic components. The entire FinFET IC 100 can then function as planned for the desired purpose.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

What is claimed is:

1. A fin field effect transistor (FinFET) integrated circuit comprising:
    a semiconductor substrate
    a plurality of fins extending from the semiconductor substrate, where each of the plurality of fins comprises a fin sidewall, where each of the plurality of fins extends to a fin height such that a trough is defined between adjacent fins, and wherein the trough comprises a trough base;
    a second dielectric positioned within the trough, where the second dielectric directly contacts the semiconductor substrate at the trough base, and where the second dielectric extends to a second dielectric height less than the fin height such that protruding fin portions extend above the second dielectric; and
    a first dielectric positioned between the fin sidewall and the second dielectric, wherein the first dielectric extends to a height no greater than the second dielectric height.

2. The FinFET of claim 1 wherein the second dielectric comprises silicon dioxide.

3. The FinFET of claim 2 wherein the second dielectric has a wet etch resistance greater than the wet etch resistance of flowable oxide.

4. The FinFET of claim 3 wherein the plurality of fins have a fin to fin distance of about 20 nanometers or less, and wherein the second dielectric is void free.

5. The FinFET of claim 2 where the second dielectric has a second dielectric top surface that is smoother than a silicon dioxide top surface formed by an etch process.

6. The FinFET of claim 2 wherein the first dielectric comprises silicon nitride.

7. The FinFET of claim 1 further comprising:
a gate dielectric contacting the plurality of fins; and
a gate electrode contacting the gate dielectric.

8. A fin field effect transistor (FinFET) integrated circuit comprising:
a semiconductor substrate;
a plurality of fins extending from the semiconductor substrate and defining a trough therebetween, wherein the plurality of fins have a fin to fin distance of about 20 nanometers or less;
a second dielectric positioned within the trough, wherein the second dielectric directly contacts the semiconductor substrate at a trough base, wherein the second dielectric comprises silicon dioxide, and wherein the second dielectric has a wet etch resistance greater than the wet etch resistance of flowable oxide, wherein the second dielectric extends to a second dielectric height less than a fin height; and
a first dielectric positioned between the second dielectric and the plurality of fins, wherein the first dielectric terminates at the second dielectric height such that the plurality of fins extend above the second dielectric height free from the first dielectric and the second dielectric.

9. The FinFET of claim 8 wherein the second dielectric positioned within the trough is void free.

10. The FinFET of claim 8 wherein the first dielectric directly contacts the semiconductor substrate at the trough base.

11. The FinFET of claim 8 wherein the first dielectric comprises silicon nitride.

12. The FinFET of claim 8 wherein the second dielectric comprises a second dielectric top surface that is smoother than a silicon dioxide top surface formed by an etching process.

13. The FinFET of claim 8 further comprising:
a gate insulator contacting the fin; and
a gate electrode contacting the gate insulator.

14. A fin field effect transistor (FinFET) integrated circuit comprising:
a semiconductor substrate;
a plurality of fins extending from the semiconductor substrate and defining a trough therebetween, wherein the trough includes a trough base;
a second dielectric positioned within the trough, wherein the second dielectric comprises silicon dioxide, wherein the second dielectric has a second dielectric top surface that is smoother than a silicon dioxide top surface formed by an etching process, and wherein the second dielectric directly contacts the semiconductor substrate at a trough base; and
a first dielectric positioned between the second dielectric and the plurality of fins, wherein the first dielectric contacts the semiconductor substrate at the trough base.

15. The FinFET of claim 14 wherein the second dielectric has a wet etch resistance greater than the wet etch resistance of flowable oxide.

16. The FinFET of claim 14 wherein the plurality of fins have a fin to fin distance of about 20 nanometers or less, and wherein the second dielectric is void free.

17. The FinFET of claim 14 wherein the first dielectric and the second dielectric terminate at a second dielectric height.

18. The FinFET of claim 17 wherein the first dielectric comprises silicon nitride.

19. The FinFET of claim 17 wherein the second dielectric height is less than a fin height.

* * * * *